United States Patent [19]

Faraci

[11] Patent Number: 4,540,227
[45] Date of Patent: Sep. 10, 1985

[54] TEST EQUIPMENT INTERCONNECTION SYSTEM

[75] Inventor: Arthur Faraci, Hauppauge, N.Y.

[73] Assignee: Grumman Aerospace Corporation, Bethpage, N.Y.

[21] Appl. No.: 592,002

[22] Filed: Mar. 21, 1984

[51] Int. Cl.$^3$ .......................................... H01R 13/631
[52] U.S. Cl. ........................... 339/17 F; 339/75 MP; 339/176 MF; 339/176 MP
[58] Field of Search ................ 339/17 F, 176 MF, 65, 339/75 M, 75 MP; 324/158 F, 73 PC

[56] References Cited

U.S. PATENT DOCUMENTS

| | | | |
|---|---|---|---|
| 2,952,002 | 9/1960 | Angele et al. | 339/75 |
| 3,070,771 | 12/1962 | Piorunneck | 339/174 |
| 3,082,398 | 3/1963 | Valach | 339/17 F |
| 3,084,302 | 4/1963 | Braeutigam | 339/17 F |
| 3,149,896 | 9/1964 | Hall | 339/75 |
| 3,149,897 | 9/1964 | Martineck | 339/17 F |
| 3,221,286 | 11/1965 | Fedde | 339/17 |
| 3,573,704 | 4/1971 | Tarver | 339/17 |
| 3,609,462 | 9/1971 | De Barros | 339/17 |
| 3,878,341 | 4/1975 | Balde | 339/17 F |
| 4,056,773 | 11/1977 | Sullivan | 324/73 PC |
| 4,072,377 | 2/1978 | Van De Loo et al. | 339/17 F |
| 4,095,412 | 6/1978 | Burke | 58/50 R |
| 4,116,516 | 9/1978 | Griffin | 339/17 F |
| 4,184,729 | 1/1980 | Parks et al. | 339/17 F |
| 4,232,928 | 11/1980 | Wickersham | 339/117 P |
| 4,257,028 | 3/1981 | Narozny et al. | 339/126 R |
| 4,261,631 | 4/1981 | Guilcher et al. | 339/75 MP |
| 4,285,118 | 8/1981 | Peppler et al. | 324/52 |
| 4,289,364 | 9/1981 | Strom et al. | 339/17 CF |
| 4,357,062 | 11/1982 | Everett | 339/73 PC |
| 4,357,575 | 11/1982 | Uren et al. | 339/65 |

FOREIGN PATENT DOCUMENTS 0030639 11/1980 European Pat. Off. ....... 339/75 MP
1430640 3/1976 United Kingdom .

OTHER PUBLICATIONS

IBM Technical Disclosure Bulletin, vol. 7, No. 12, May 1965, "Connector for Compliant Copper-Clad Card", Johnson et al.
Hughes Aircraft Connecting Devices Bulletin, 10-1-5-76, pp. 1-3.
"Gold Dot Connections in Advanced Airborne Electronics", Hughes Aircraft, pp. 1-16.

Primary Examiner—John McQuade
Attorney, Agent, or Firm—Richard G. Geib

[57] ABSTRACT

An electronics interconnection system with a plug cartridge assembly having a planar body on which electronic equipment is plugged into terminations which are connected to a flat, flexible multiconductor cable terminus array on the bottom surface of a plug portion of the plug cartridge assembly. The plug portion is inserted into the top portion of a receptacle module assembly in an electronics unit, such as an automatic test equipment unit, which receptacle module contains in the bottom portion thereof a platen on which is mounted a connector having on its upper surface a flat, flexible multiconductor cable terminus array in circuit with electronic components in the electronic unit. The interconnection is made by activating an actuator which raises the platen to bring projecting electrical contacts on the conductors of the terminus array of the connector into electrical contact with the terminus array on the plug. Guide means are provided on both the connector and the plug such that the engagement thereof insures the precise alignment of the projecting contacts with the associated conductors when the interconnection is made.

11 Claims, 12 Drawing Figures

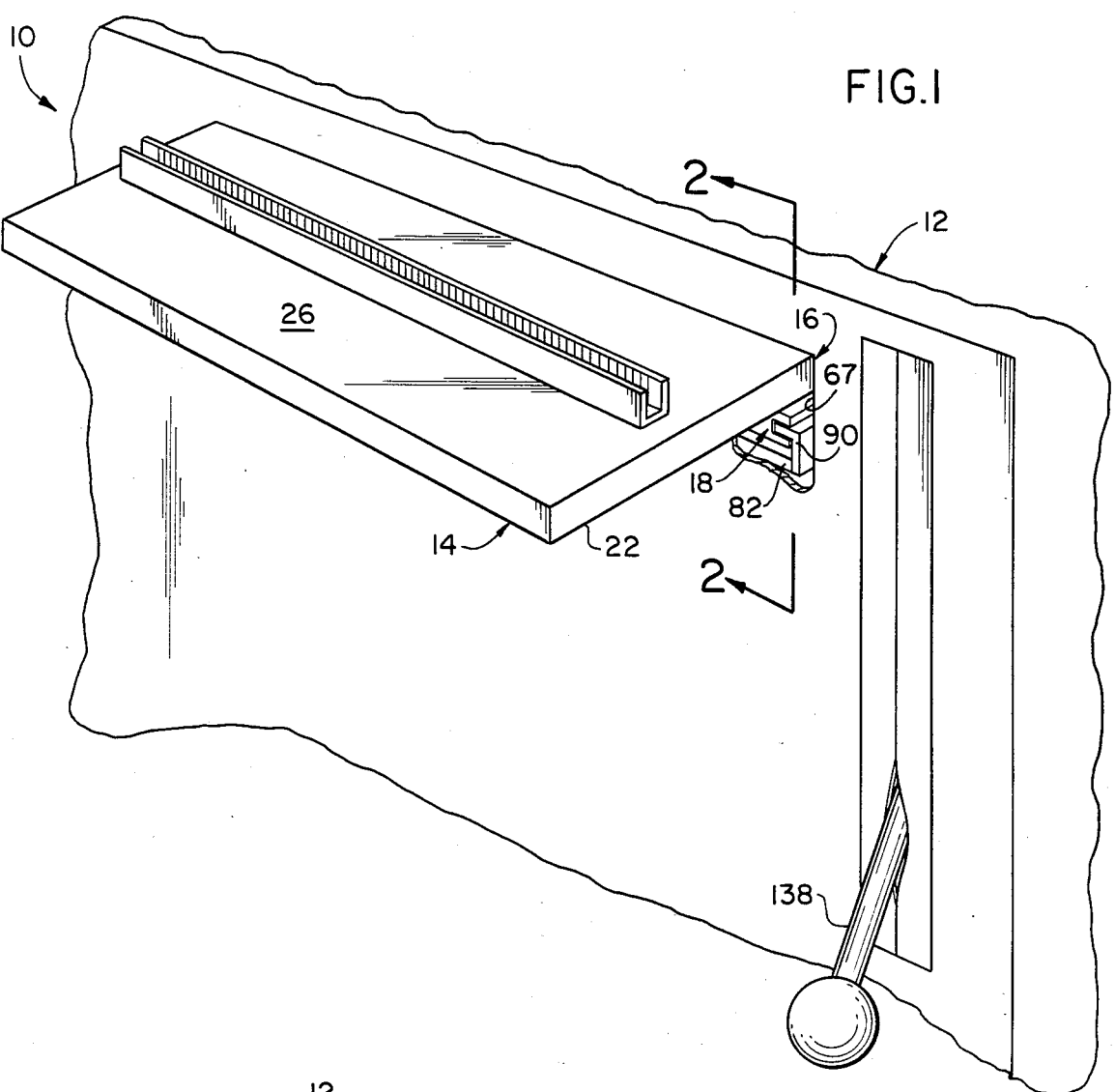
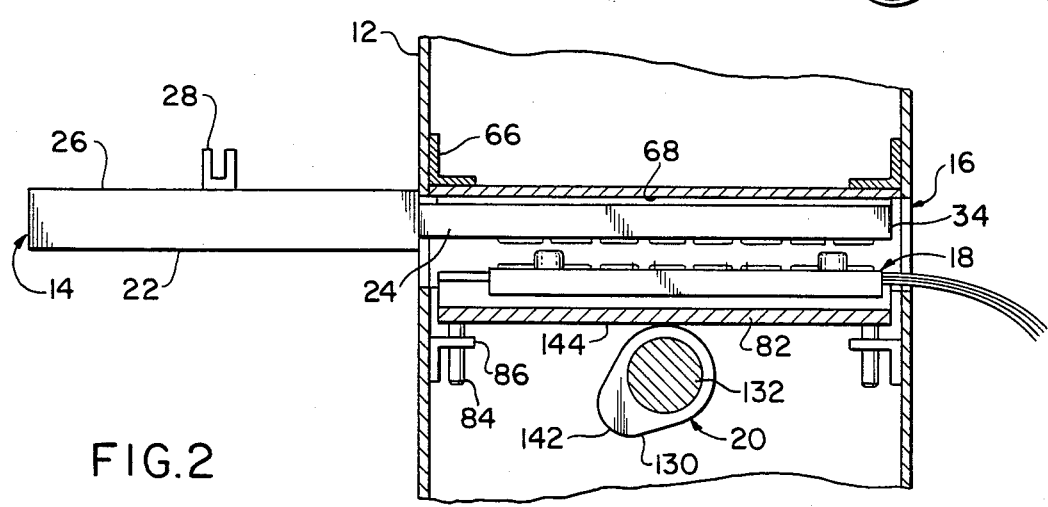

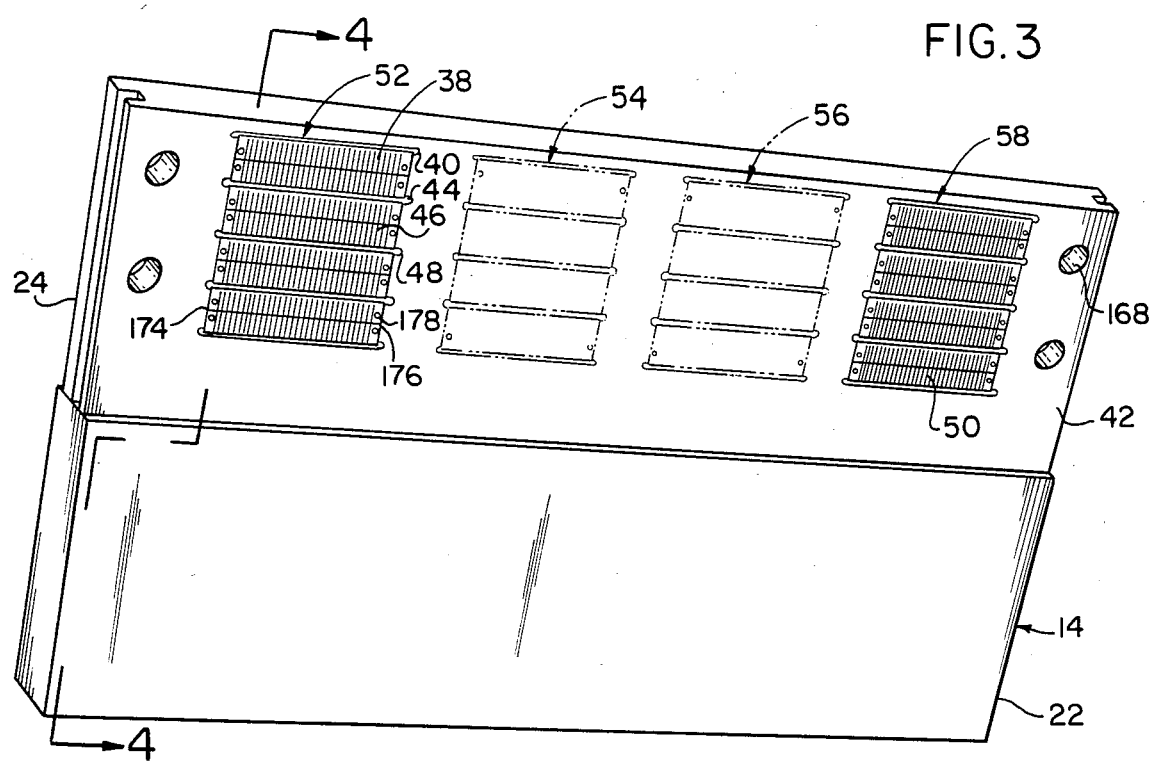
FIG. 3
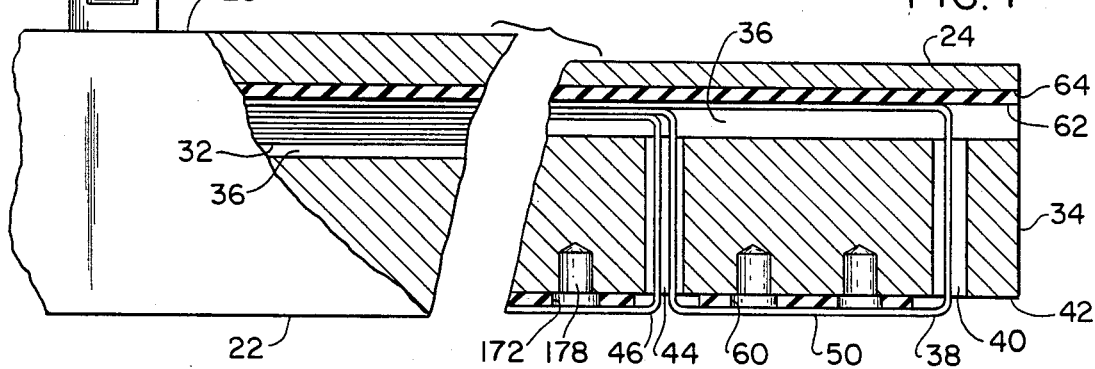
FIG. 4
FIG. 5

TEST EQUIPMENT INTERCONNECTION SYSTEM

BACKGROUND OF THE INVENTION

1. Field Of the Invention

This invention relates to electrical connecting devices and, more particularly, to electrical interconnections in which terminations are made by contact pressure between flat, flexible multiconductor cables.

2. Summary Of The Invention

Various applications exist for reliable interconnections between electronic components of equipment having high density wiring system and a requirement for the frequent connecting and disconnecting the terminations. In conventional systems, male pin connectors mating with female socket connectors are generally employed. The present trend to reduced size in electronic components and the requirement for high-density wiring in a small volume has lead to an increase in interconnection failure due to broken or bent pins. The problem is particularly serious in applications such as testing equipment where the routine testing of electronic components requires the connectors of the test equipment to be subjected to a large number of connections and disconnections.

To overcome these and other disadvantages in the prior art, the interconnection system of the present invention has been designed to eliminate the requirement for pin-type connectors. In this invention, a plug cartridge assembly having a planar body on which electronic equipment is plugged into terminations which are connected to a flat, flexible multiconductor cable terminus array on the bottom surface of a plug portion of the plug cartridge assembly. The plug portion is inserted into the top portion of a receptacle module assembly in an electronics unit, which receptacle module contains in the bottom portion thereof a platen on which is mounted a connector having on its upper surface a flat, flexible multiconductor cable terminus array in circuit with electronic components in the electronic unit. To make the interconnection, an actuator raises the platen to bring projecting electrical contacts on the conductors of the terminus array of the connector into electrical contact with the conductors of the terminus array on the plug. Guide means are provided on both the connector and plug to insure the precise alignment of the projecting contacts with the associated conductor when the interconnection is made.

Over the years a number of designs for pin-less connectors have evolved for providing terminations between flat, flexible multiconductor cables. The design approach for accomplishing the terminations have varied from connectors such as those disclosed by W. Angele et al., W. L. Griffin, and R. A. Strom et al., in U.S. Pat. Nos. 2,952,002; 4,116,516 and 4,289,364; respectively, in which the conductors of one cable are pressed against the conductors of the other cable to make the interconnection; to designs such as those taught by H. Piorunneck and J. R. Hall in U.S. Pat. Nos. 3,070,771 and 3,149,896 respectively, in which spring-biased contacts in the connector are used to establish electrical continuity with flat, flexible multiconductor cables. In those prior art designs, the connections were made between flat conductors pressed together or by flat contact "fingers" pressed against flat conductors; consequently, the current-carrying capacity of the connection could be marginal. In order to alleviate these problems, raised contacts were provided on at least one of the conductors of the connection to achieve higher contact forces. Such raised contacts are taught in the prior art by A. H. Johnson et al. in IBM Technical Disclosure Bulletin, Vol. 7, No. 12, May, 1965; and by G. A. Fedde and H. L. Parks et al. in U.S. Pat. Nos. 3,221,286 and 4,184,729 respectively.

However, the prior art does not teach an interconnection system that is particularly suitable for use with automated test equipment in which the components to be tested are plugged into a standard connector on a plug cartridge that, in turn, is plugged into an interconnection in the test equipment which employs a pressure-type termination between flat multiconductor terminus arrays to eliminate problems with wear and damage to the often inaccessible connectors of the test equipment.

DESCRIPTION OF THE DRAWINGS

For the purpose of illustrating the invention, there is shown in the drawings the forms which are presently preferred; it should be understood, however, that the invention is not necessarily limited to the precise instrumentalities and arrangements here shown.

FIG. 1 is a perspective view of an interconnection system of the invention;

FIG. 2 is a cross-sectional view taken along line 2—2 of the interconnection system of FIG. 1;

FIG. 3 is a perspective view of the underside of a plug cartridge assembly embodied in the system of the invention;

FIG. 4 is a cross-sectional view taken along line 4—4 of the plug cartridge assembly of FIG. 3;

FIG. 5 is a front elevation in partial section of a receptacle module assembly embodied in the system of the invention;

DESCRIPTION OF THE PREFERRED EMBODIMENTS

Figure 6:
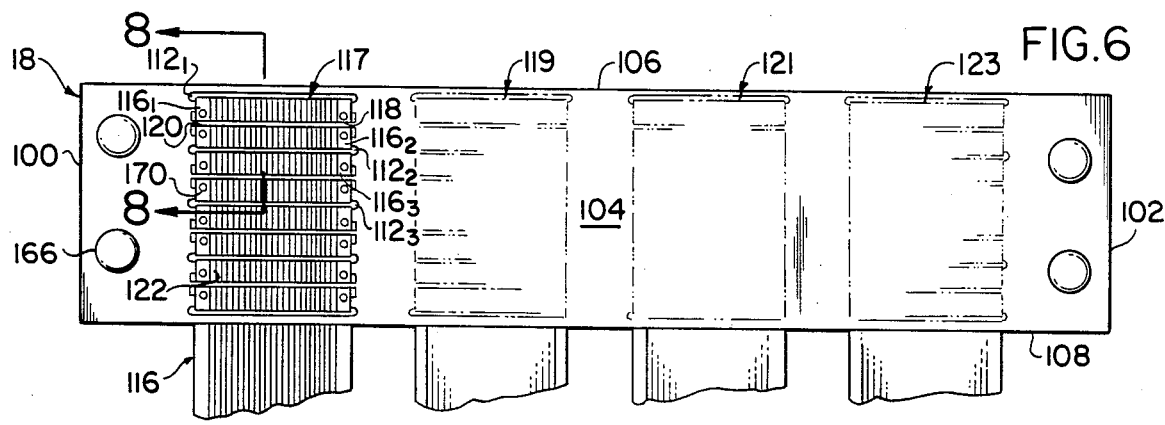
FIG. 6 is a top plan view of a connector assembly embodied in the system of the invention.

Having now more particular reference to the drawings, FIG. 1 illustrates an embodiment of the interconnection system 10 of the invention mounted in a unit of electronic equipment 12. Because this interconnection system is a pinless electrical connector device such that the normal equipment failure due to connector pin wear and bendings is substantially eliminated; It will be appreciated that the system is eminently suitable for use with automatic test equipment (ATE) for the large-scale testing of electronic units, modules, and printed circuit boards.

Interconnection system 10 comprises a plug cartridge assembly 14, a receptacle module assembly 16, a connector assembly 18, and actuating means 20 (see FIG. 2). Plug cartridge assembly 14 has a body member 22 having a planar plug portion 24 extending therefrom. Body member 22 can have a planar construction which, should the interconnection system 10 be used with a ATE unit, provides a flat surface 26 upon which the electronic unit under test (UUT) is supported and which also can serve as a work surface. It will be recognized, however, that the design of the body member can be different than the shown if the requirements of any particular application have to be accommodated. As illustrated in FIG. 4, the body member 22 is provided with an array of connectors 28 which are used to receive the terminations of a UUT such as a circuit card or board 30. Each connector of the array is in circuit with a number of flat, flexible printed wiring cables which forms a cable harness 32 which runs to the plug portion end 34 of the plug cartridge assembly through a passage 36. Each of the multiple flat ribbon cables of the harness running through passage 36 is threaded through slots opening on the surface such that a section of each cable extends along the surface of the plug portion to present an array of conductors to which electrical interconnections can be made. As an example of this arrangement of the individual flexible flat multiconductor cables, reference should be made to cable 38 in FIG. 4, which cable is threaded through a slot 40 extending from passage 36 to the bottom surface 42 of the plug portion. Cable 38 is run a relatively short distance along bottom surface 42 and then is threaded through a slot 44 for return by means of passage 36 back to the connector 28. A second cable 46 is routed from passage 36 through slot 44 and along bottom surface and through a slot 48 to passage 36 for return to the connector. As perhaps best seen in FIG. 3, the flexible flat multiconductor cables 38 et. seq. are oriented such that sections 50 of bare conductors are presented at bottom surface 42 of the plug forming a terminus array so that electrical contact therewith can be made readily. As may also be best seen in FIG. 3, this design sequence is repeated to form an array of, in this example, four rows 52, 54, 56, and 58 of spaced-apart electrical conductors that are in circuit with an array of connectors 28 into which a UUT is plugged. A resilient plug circuit pad 60 is used to back conductor sections 50 and a resilient clamping pad 62 is provided on one wall 64 of passage 36 (FIG. 4).

A receptacle module assembly 16 (FIG. 5) is provided in the ATE unit 12 for the interconnection. Module assembly 16 (also see FIG. 2) has appropriate structure 66 framing the receptacle opening 67 and a top wall 68 extending its length and width and side walls 70 and 72 along the sides thereof. A pair of guide rails 74 and 76 each having an inwardly projecting rib or flange 78 and 80 respectively are fixed on the upper part of the receptacle along the sidewalls and extend the length thereof. A plate or platen 82, which is mounted by suitable means such as a sliding pin 84 in guide 86 arrangement for limited vertical movement (FIG. 2), forms, in effect, the bottom wall of the receptacle. A pair of lower guide rails 88 and 90 each having an inwardly projecting rib or flange 92 and 94 respectively are fixed on the side edges of the platen 82 and extend the length thereof.

Figure 7:
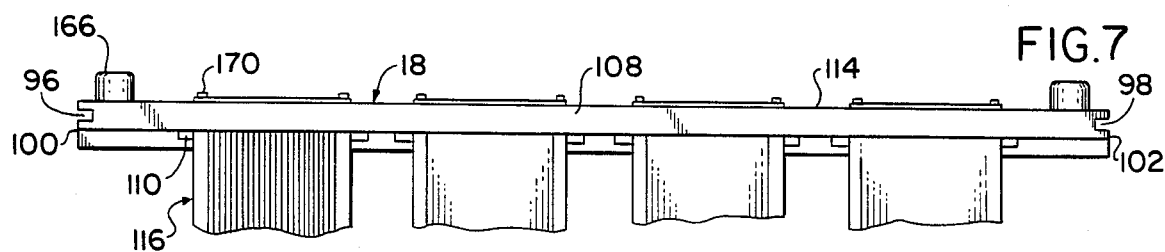
FIG. 7 is a rear elevation of the connector assembly of FIG. 6.
Figure 8:
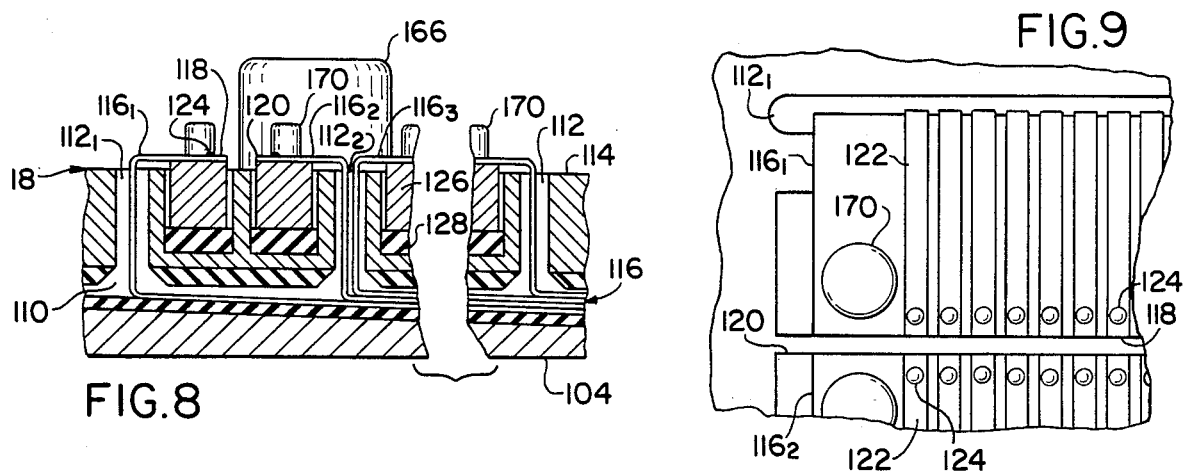
FIG. 8 is a cross-sectional view taken along line 8—8 of the connector assembly of FIG. 6.
Figure 9:
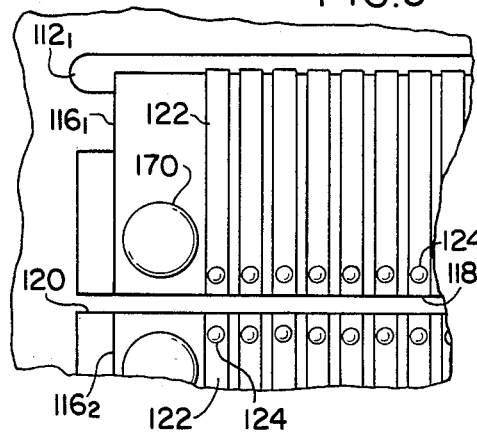
FIG. 9 is a fragmentary top plan view showing a portion of the terminus array of the connector assembly of FIG. 6.

Connector assembly 18 is installed by means of grooves 96 and 98 running the length of its side edges 100 and 102 (see FIGS. 6–8) on the lower guide rails 90 and 88 respectively on the platen 82 of the receptacle module assembly 16. The connector assembly has a planar body 104 having a front edge 106, a rear edge 108, and the side edges 100 and 102. Connector body 104 is provided with a plurality of slot-like passages 110 running from the rear edge 108 thereof to substantially its front edge 106. A plurality of vertical slots 112 are cut into the body 104 from the upper surface 114 thereof to passages 110. Received in each passage 110 is one end of a flat, flexible printed wiring multiple cable harness 116 which is in electrical circuit with circuit elements (not shown) of the ATE 12. As perhaps best seen in FIGS. 8 and 9, each of the individual flexible flat multiconductor cables of the cable harness, such as cable $116_1$, is received in passage 110 and a length of the end 118 of the cable is routed up slot 112 and is fixed on the upper surface 114 of the connector body 104. A length of the end 120 of a second cable $116_2$ is routed up slot $112_2$ and is fixed on the upper surface of the body in alignment with the end 118 of cable $116_1$. The same arrangement is followed with cable $116_3$ and the subsequent cables of cable harness 116. Each flat multiconductor cable in the harness is oriented such that sections 122 of bare conductor at the end portions of the cables are presented upward to form a terminus array. Adjacent the end of each conductor in each of the cables is a raised contact 124 projecting from the surface thereof. Contacts 124 can be formed in any suitable manner and they should be of an electrically conducting resilient material capable of exhibiting plastic deformation. Preferably, the contacts are formed of hard gold using a deposition process and the size thereof will be governed by the specifics of the equipment in which they are to be used. In a typical application, the raised contacts had a diameter of approximately 0.030 in and a thickness of about 0.002 in. A resilient backing is provided in the area of the connector body 104 underlying the contacts. This backing can comprise a pressure pad 126 resiliently urged upwardly by suitable means such as a thickness of elastomeric material 128 or other known resilient means such as a spring. In the connector assembly 18 embodied in FIGS. 6 and 7, an arrangement of four passages 110 accommodating four flat flexible cable harnesses 116 such that four terminus arrays 117, 119, 121, and 123 are present to establish terminations with the bare conductors 50 of the terminus arrays 52, 54, 56, and 58 of the plug cartridge assembly 14. Using this arrangement, it is feasible to obtain an electrical interface having over 1,000 termination points.

The connector assembly 18 on platen 82 is forced into contact with plug portion 24 of the plug cartridge assembly 14 to establish electrical interconnection therebetween by actuating means which, as shown in FIGS. 2 and 5, is a cam mechanism 20. Cam mechanism 20 comprises an elongated cam 130 on a shaft 132 which is mounted for rotation in suitable bearings 134 and 136 installed on structure in the receptacle module assembly 16 in the ATE 12. A suitable handle 138 mounted on the end 140 of the shaft 132 enables the cam to be rotated manually such that its nose 142 operates on the bottom 144 of the platen 82 to raise the connector assembly 18 to establish the electrical interconnection.

Figure 10:
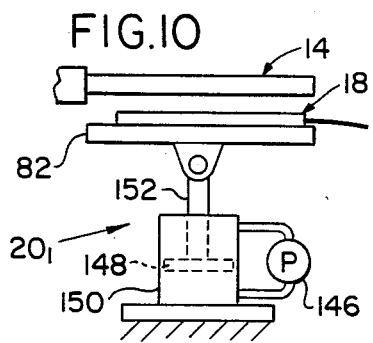
FIG. 10–12 are schematic views of further embodiments of the interconnection system of the invention.
Figure 11:
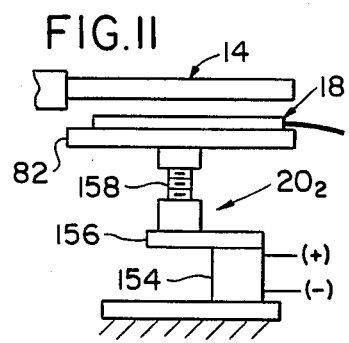
Figure 12:
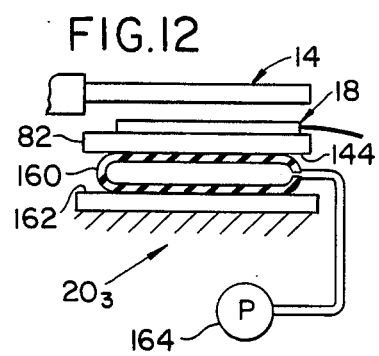

Although the actuating means 20 is shown to be a manually operated cam mechanism in the FIGS. 1, 2, and 5 embodiments of the invention, it will be appreciated that other suitable known actuating mechanisms can be used as well. For example, a hydraulic system $20_1$, such as shown in FIG. 10 in which a source of hydraulic pressure such as a pump 146 is used to selectively apply pressure to a piston 148 in hydraulic cylinder 150 to raise or lower the platen 82 and connector assembly 18 by means of an appropriate linkage 152 can be employed to make or break the electrical interconnection with the plug cartridge assembly 14. Alternately the actuating means $20_2$, as shown in FIG. 11, can be an electric motor 154 that is used to drive through a suitable gear train 156 an appropriate actuating means such as, for example, a screwjack 158 to make or break the electrical interconnection. A yet further example of an actuating means 20₃ is illustrated in FIG. 12. In this embodiment, an inflatable bladder 160 interposed between fixed structure 162 and the bottom 144 of the platen 82 is selectively inflated or deflated either hydraulically or pneumatically by suitable pump means 164 to make or break the interconnection. Irrespective of the means used to actuate the platen to make the electrical interconnection, it is required that an evenly distributed pressure of about 6,000 psi to 14,000 psi be provided such that good electrical contact is assured.

In operation, the interconnection system is set up with the connector assembly 18 installed by means of the grooves on its side edges on the lower guide rails 88 and 90 on the platen 82 in the receptacle module assembly 16 in the ATE unit 12. If a circuit card 30 is to be tested by the ATE, the circuit card is plugged into the connectors 28 on the body 22 of the plug cartridge assembly 14 and the plug portion 24 thereof is then slipped on to the upper guide rails 74 and 76 and is then pushed in until it is securely seated in the receptacle module assembly with the terminus arrays 52, 54, 56, and 58 of the plug portion positioned over the terminus arrays 117, 119, 121, and 123 of the connector. The interconnection is then made by rotating handle 138 to cause the cam 130 to move the connector into contact with the plug portion. To assure the initial gross alignment of the connector 18 with the plug 24, four guide pins 166 on the upper surface 114 of the connector engage four guide sockets 168 in the under surface of the plug. The final precise alignment of the raised contacts 124 on the connector with the conductors 50 on the plug is accomplished by the alignment pins 170 on the connector engaging alignment holes 172 in the side edges 174 and 176 of the flexible flat multiconductor cables of the terminus arrays, which alignment holes register with alignment sockets 178 in the under surface 42 of the plug. Thus, the precise alignment of the raised contacts on the connector assembly with the conductors on the plug assembly is insured when the interconnection is made.

In interconnection system 10 described herein, there is disclosed an arrangement in which the plug cartridge assembly 14 is inserted into the upper part of the receptacle module assembly 16 and the platen 82, and the platen 82 and connector assembly 18 is raised by the actuator means 20 to make the interconnection. It will be appreciated that this arrangement could be reversed such that the plug cartridge assembly is below the connector assembly which would be lowered to make the interconnection. A further feasible design is one in which the components of the interconnection system of the invention are arranged side-by-side horizontally.

Although shown and described in what are believed to be the most practical and preferred embodiments, it is apparent that departures from the specific methods and designs described and shown will suggest themselves to those skilled in the art and may be made without departing from the spirit and scope of the invention. I, therefore, do not wish to restrict myself to the particular constructions described and illustrated, but desire to avail myself of all modifications that may fall within the scope of the appended claims.

Having thus described my invention, what I claim is:

1. An interconnection system for electronic equipment comprising:
    a plug cartridge assembly having a body member and a planar plug portion extending therefrom, electrical connectors mounted on said body member in electrical circuit with flat, flexible, spaced-apart electrical conductors which form a first conductor terminus array on a surface of said plug portion, and alignment means on said plug portion associated with said first conductor terminus array;
    a receptacle module assembly mounted in electronic equipment and having a recess therein for receiving said plug portion, said recess having a planar first wall and side walls, and a platen defining a second planar wall of said recess, said platen being arranged for movement towards and away from said first wall;
    a planar connector assembly mounted on said platen, said planar connector assembly having flat, flexible spaced-apart electrical conductors which form a second conductor terminus array on a surface thereof facing the first conductor terminus array on said plug portion, said second conductor terminus array being in electrical circuit with circuit elements in said electronic equipment, each of said conductors in said second conductor terminus array having a raised contact of resilient electrically conductive material capable of exhibiting plastic deformation projecting from the surface proximate the end thereof, and alignment means on said planar connector assembly associated with said second conductor terminus array;
    actuating means activated after said plug portion has been inserted into said receptacle recess with said conductor terminus arrays of said plug portion and said planar connector assembly in a mating relationship such that said activation moves said planar connector assembly to bring said raised contacts thereon into good electrical contact with said plug portion terminus conductor array, whereby the precise alignment of said raised contacts with said plug portion conductor terminus array is produced by said alignment means and high contact forces are produced by said actuating means such that good electrical continuity with said interconnection system is achieved.

2. The interconnection system recited in claim 1 wherein the conductor terminus arrays on the plug portion and the planar connector assembly comprise selected sections of flat, multiconductor ribbon-type cable, the number, size, spacing, and orientation of the conductors on said plug portion array being a mirror image of those on said planar connector assembly.

3. The interconnection system recited in claim 1 wherein the electronic equipment is a unit of automatic test equipment and wherein the electronic component being tested is plugged into the electrical connectors mounted on the plug cartridge body member.

4. The interconnection system recited in claim 1 wherein the actuating means is a elongated rotatable mechanical cam extending the width of the platen whereby the rotation of the cam causes its projecting nose to move said platen and the planar connector assembly thereon into electrical contact with the plug portion conductor array such that an electrical interconnection is established.

5. The interconnection system recited in claim 4 wherein the rotatable cam is manually actuated.

6. The interconnection system recited in claim 1 wherein the actuating means is a fluid activated piston and cylinder arrangement whereby the selected admission of fluid into said cylinder moves said piston such that a linkage connected thereto moves the platen and planar connector assembly to make and break the electrical interconnection.

7. The interconnection system recited in claim 1 when the actuating means is an electric motor powering a screw jack through a gear train.

8. The interconnection system recited in claim 1 wherein the actuating means an inflatable bladder interposed between fixed structure and the platen and wherein means are provided to inflate and deflate said bladder selectively to make and break the electrical interconnection.

9. The interconnection system recited in claim 1 wherein the alignment means comprise a pin and socket arrangement with the pins on one of the mating components and the sockets on the other establishing the alignment for the electrical interconnection.

10. The interconnection system recited in claim 9 wherein selected pins of the pin and socket arrangement are relatively larger in size than the other pins and wherein said larger pins provide the gross alignment of the plug portion and the connector assembly and the said smaller pins provide the precise alignment of the conductors with their mating conductors in the conductor terminus arrays for the electrical interconnection.

11. An interconnection system for electronic equipment comprising:
a plug cartridge assembly having a body member and a planar plug portion extending therefrom, an electronic unit mounted on said body member electrically interconnected with flat, flexible, spaced-apart electrical conductors which form a first conductor array on a surface of said plug portion, and alignment means on said plug portion associated with said first conductor array;
a recess in electronic equipment, said recess forming a receptacle module assembly for receiving said plug portion, a platen in said recess, said platen being arranged for movement towards and away from said plug portion received in said receptacle module assembly;
a planar connector assembly mounted on said platen, said connector assembly having flat, flexible, spaced-apart electrical conductors which form a second conductor array on a surface thereof facing said first conductor array on said plug portion, and second conductor array being in electrical circuit with circuit elements in said electronic equipment, each of said conductors in said second conductor array having a raised contact dot of gold projecting from the conductor surface proximate the end thereof; and alignment means on said connector assembly associated with said second conductor array;
actuating means activated after said plug portion has been received in said receptacle module assembly such that said activation moves said connector assembly to bring said raised gold dot contacts thereon into good electrical contact with said plug portion conductor array, whereby the precise alignment of said raised contacts with said plug portion conductor array is produced by said alignment means, and high contact forces are produced by said actuating means such that good electrical continuity with said interconnection system is achieved.

* * * * *